United States Patent
Tang et al.

(10) Patent No.: US 7,662,690 B2
(45) Date of Patent: Feb. 16, 2010

(54) METHOD OF PREPARING A SEMICONDUCTOR SUBSTRATE UTILIZING PLURAL IMPLANTS UNDER AN ISOLATION REGION TO ISOLATE ADJACENT WELLS

(75) Inventors: Shaoping Tang, Plano, TX (US); Zhiqiang Wu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 264 days.

(21) Appl. No.: 11/343,695

(22) Filed: Jan. 31, 2006

(65) Prior Publication Data

US 2007/0176263 A1    Aug. 2, 2007

(51) Int. Cl.
*H01L 21/761* (2006.01)
(52) U.S. Cl. .................. 438/294; 438/420; 438/433; 438/529; 257/E21.544
(58) Field of Classification Search .................. 438/529
See application file for complete search history.

(56) References Cited

U.S. PATENT DOCUMENTS

| 5,024,961 | A | | 6/1991 | Lee et al. |
| 5,605,851 | A | * | 2/1997 | Palmieri et al. ............. 438/194 |
| 5,814,866 | A | * | 9/1998 | Borland ...................... 257/369 |
| 2002/0109196 | A1 | | 8/2002 | Fujisawa et al. |
| 2004/0097051 | A1 | * | 5/2004 | Wu et al. .................... 438/400 |
| 2004/0169236 | A1 | | 9/2004 | Sridhar et al. |

* cited by examiner

*Primary Examiner*—Stephen W Smoot
(74) *Attorney, Agent, or Firm*—Wade J. Brady, III; Frederick J. Telecky, Jr.

(57) ABSTRACT

Multiple blanket implantations of one or more p type dopants into a semiconductor substrate are performed to facilitate isolation between nwell regions subsequently formed in the substrate. The blanket implantations are performed through isolation regions in the substrate so that the p type dopants are implanted to depths sufficient to separate the nwell regions. This increased concentration of p type dopants helps to mitigate leakage between the nwell regions as the nwell regions are brought closer together to increase packing densities.

12 Claims, 3 Drawing Sheets

METHOD OF PREPARING A SEMICONDUCTOR SUBSTRATE UTILIZING PLURAL IMPLANTS UNDER AN ISOLATION REGION TO ISOLATE ADJACENT WELLS

FIELD OF INVENTION

The present invention relates generally to semiconductor processing, and more particularly to isolating nwell regions from one another to mitigate leakage.

BACKGROUND OF THE INVENTION

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer. Techniques that facilitate device scaling increased packing densities are thus desirable.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The disclosure herein pertains to mitigating leakage between nwell regions formed within a semiconductor substrate. Multiple blanket implants of one or more p type dopants are utilized to separate the nwell regions. The blanket implants are performed after isolations regions are formed in the substrate so that the p type dopants are implanted to depths effective to separate adjacent nwell regions. The implanted p type dopants mitigate leakage between the nwell regions as the nwell regions are brought closer together to increase packing densities.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
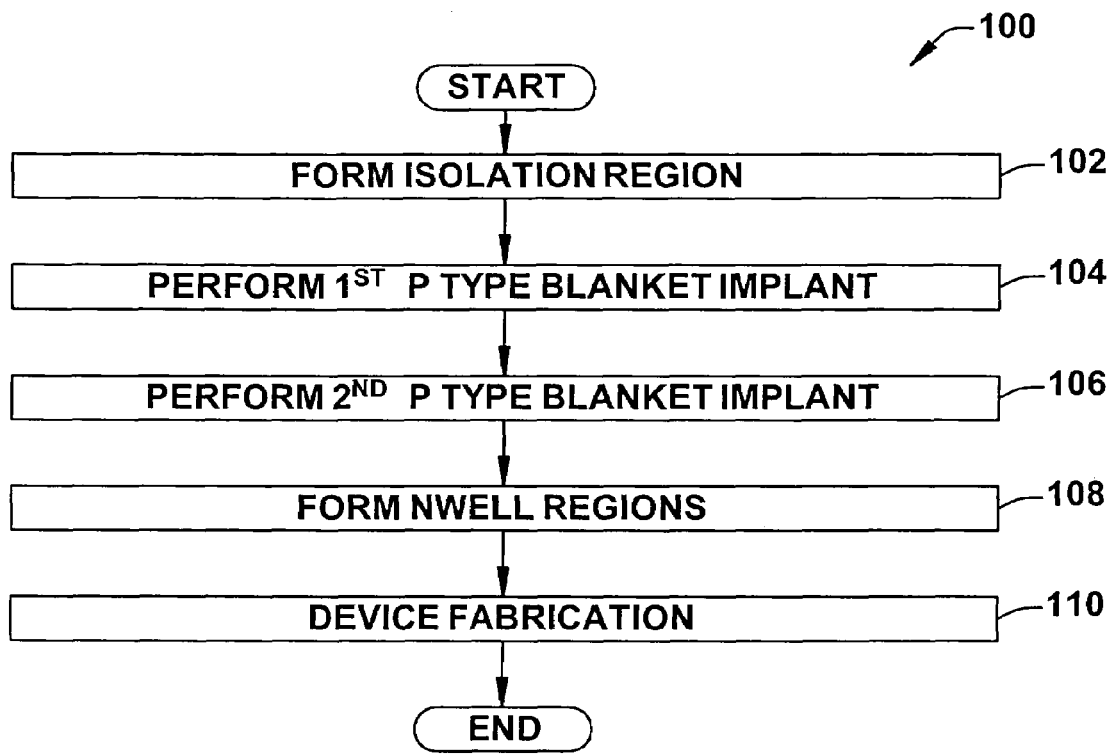
FIG. 1 is a flow diagram illustrating an exemplary methodology for isolating nwell regions according to one or more aspects or embodiments of the present invention.
Figure 2:
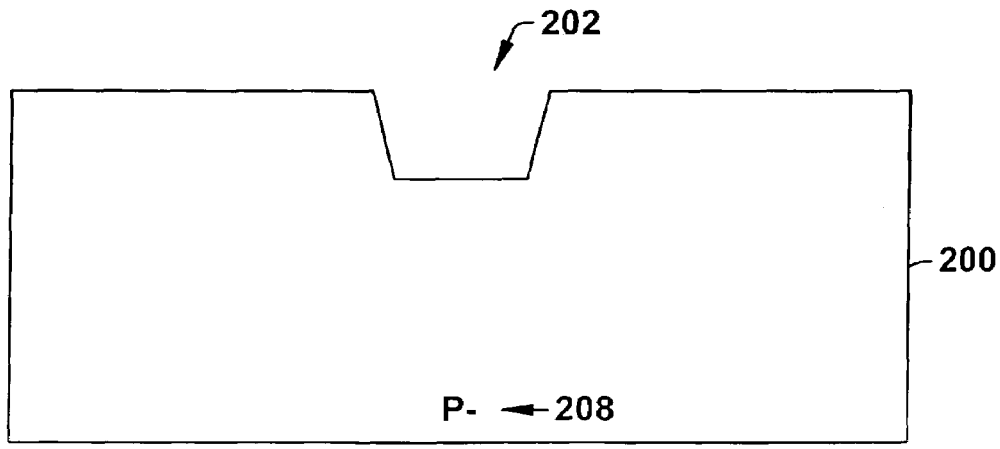
FIGS. 2-6 are cross-sectional views of a semiconductor substrate wherein nwell regions are isolated from one another according to one or more aspects or embodiments of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

A methodology 100 is illustrated in FIG. 1 for separating nwell regions formed within a semiconductor substrate according to one or more aspects or embodiments of the present invention, and FIGS. 2-6 are cross sectional views of a semiconductor substrate 200 wherein such a method is implemented. While the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the present invention. Further, one or more of the acts depicted herein may be carried out in one or more separate acts and/or phases.

Figure 3:
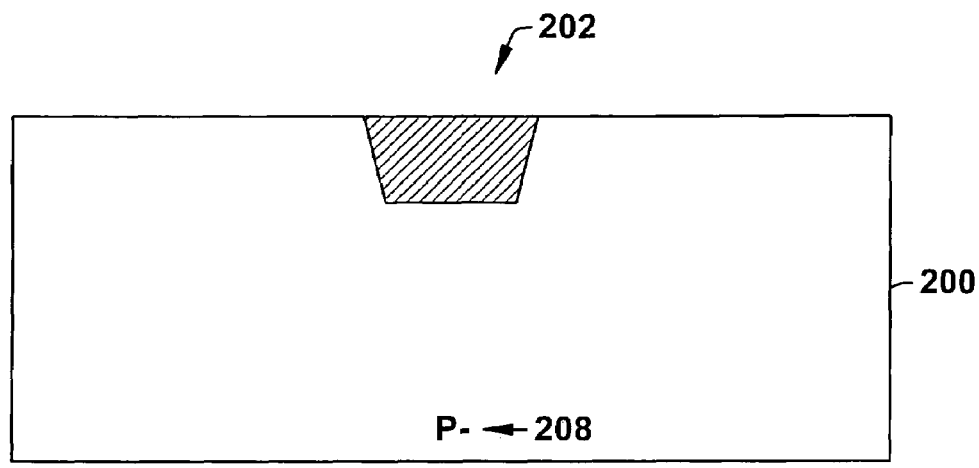

At the outset, an isolation region is formed within the semiconductor substrate 200 at 102. It will be appreciated that the isolation region 202 can comprise any type of electrically isolating or non-conductive material, such as STI and/or LOCOS, for example. In the illustrated example, the isolation region 202 comprises STI, wherein a trench is initially patterned into the substrate 200 (FIG. 2), and then filled with a dielectric material, such as an oxide based material, for example (FIG. 3). It will be appreciated that this patterning (as with all masking and/or patterning mentioned herein) can be performed in any suitable manner, such as with lithographic techniques, for example, where lithography broadly refers to processes for transferring one or more patterns between various media. In lithography, a light sensitive resist coating (not shown) is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched). Additionally, substrate or semiconductor substrate as used herein may comprise any type of semiconductor body (e.g., silicon, SiGe, SOI) such as a semiconductor wafer or one or more die on a wafer, as well as any other type of semiconductor and/or epitaxial layers associated therewith.

Figure 4:
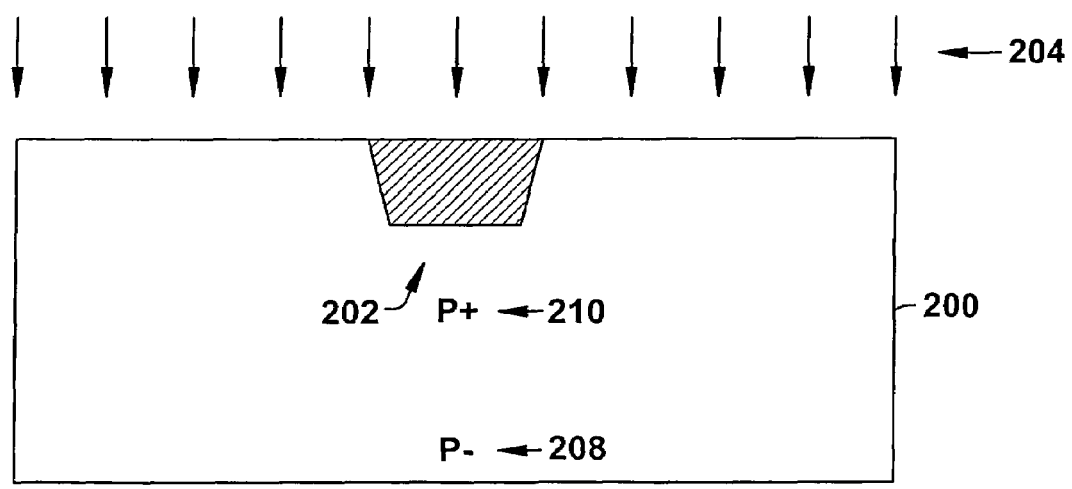

After forming the isolation region 202, a first blanket implant 204 is performed at 104 wherein a p type dopant, such as boron, for example, is implanted into the substrate 200 to increase the concentration of p type dopants therein (FIG. 4). In the illustrated example, the substrate 200 is depicted as having an initial doping profile of P-208 that is uniform across the substrate. This doping profile may correspond, for example, to a concentration of around $2e_{14}/cm^3$, which provides the substrate 200 with a relatively high resistivity, such as between about 20 ohm-cm and about 60 ohm-cm, for example. Such a resistivity is desirable to suppress noise and provide a high quality (Q) factor for passive components, particularly where RF functions are integrated onto a CMOS chip for system on chip applications. The first implant is done at a relatively high energy of between about 300 keV and about 650 keV and at a dose of between about $0.5e^{12}/cm^2$ and about $5\,e^{12}/cm^2$. This facilitates implanting the p type dopant to a depth sufficient to mitigate leakage or punchthrough between adjacent nwell regions that are subsequently formed.

It will be appreciated that since the first blanket implant 204 is performed through the isolation region 202 (which can have a thickness of between about 3000 Angstroms and about 3500 Angstroms, for example), the p type dopant is not implanted as deeply under the isolation region 202 as it is in other regions of the substrate 200. Basically, the isolation region, and more particularly the dielectric material therein, slows down the p type dopant during the implantation process so that the p type dopant does not penetrate as deeply into the substrate 200 under the isolation region 202 as it does in other areas of the substrate 200. Generally, the p type dopant is implanted so deeply into other areas of the substrate 200 that it has little to no effect on those other regions. Accordingly, in the illustrated example the effect of the additional p type dopant is only depicted under the isolation region 202, but not in other areas of the substrate 200, where the p type dopant profile is illustrated as increasing from P-208 to P+210 in the area under the isolation region 202, but is not illustrated as changing in other areas of the substrate 200.

Figure 5:
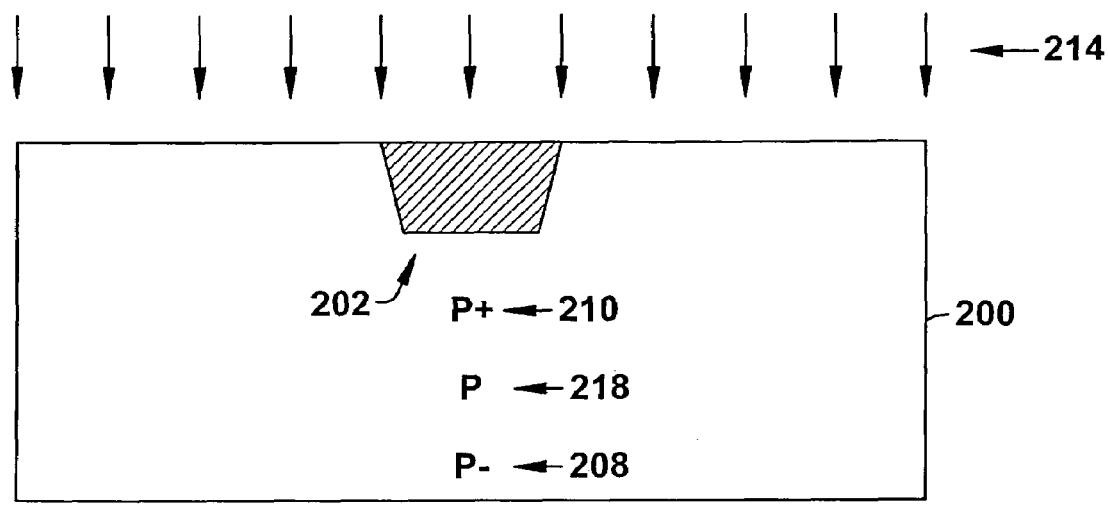

A second blanket implant 214 of a p type dopant is then performed at 106 (FIG. 5). This blanket implant 214 is performed at a slightly greater energy than the first implant 204 so that the p type dopant is implanted to a slightly greater depth than the p type dopant from the first implant 204, such as at an energy of between about 450 keV and about 900 keV and at a dose of about $1e^{12}/cm^2$. The second implantation is generally effective to mitigate leakage or punchthrough that may develop between lower portions of the subsequently formed nwell regions or even underneath the nwell regions. As before, except for under the isolation region 202, the dopant from the second blanket implantation process 214 is implanted so as to have little to no effect on the other regions of the substrate 200. Accordingly, merely the area under the isolation region 202 is depicted as increasing from P-208 to P 218 in FIG. 5.

Figure 6:
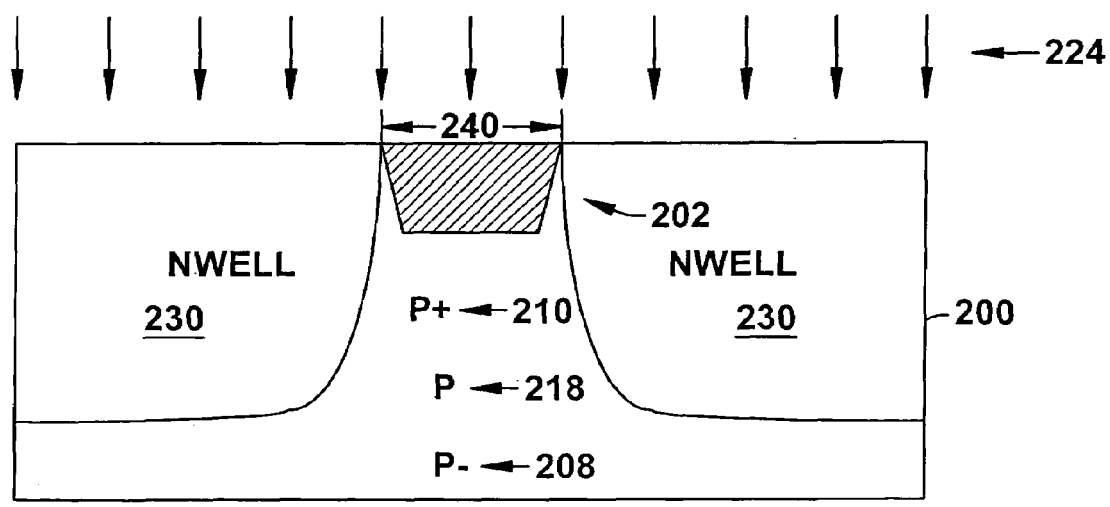

With the substrate 200 doped to mitigate leakage between nwell regions, a third implantation process 224 is performed at 108 to establish the nwell regions 230 (FIG. 6). The nwell regions can be formed by implanting one or more n type dopants, such as arsenic, phosphorous and/or antimony, for example, at an energy of between about 250 keV and about 500 keV using phosphorus and a dose of between about $3e^{13}/cm^2$ and about $8e^{13}/cm^2$, for example. It will be appreciated that a selectively patterned mask can be used in forming the nwell regions 230 to position the nwell regions at desired locations. In such an example, the nwell regions 230 may extend down into the substrate 200 to a depth of between about 1.4 micrometers and about 2.8 micrometers, while the p type dopant from the first blanket implant 204 may extend down into the substrate 200 to a depth of between about 1.2 micrometers and about 2.5 micrometers, and the p type dopant from the second blanket implant 214 may extend down into the substrate 200 to a depth of between about 2 micrometers and about 3.2 micrometers, for example (as measured from the surface of the substrate 200). In this manner, an increased concentration of p type dopants exists at least along the entire depth of the nwell regions 230 to separate the nwell regions 230 from one another and thus mitigate leakage that may occur there-between. This is particularly useful as device dimension are continually reduced to increase packing densities. For example, the width of isolation regions, such as isolation region 202, are continually being reduced to allow more fabrication to occur on a single substrate. Narrowing the width 240 of isolation region 202, however1 brings the nwell regions 230 closer together and increases the likelihood that leakage will occur between these regions. As such, performing a dual blanket implant as described herein facilitates progression in semiconductor fabrication by allowing certain regions on the semiconductor substrate (e.g., the nwell regions 230) to be formed closer to one another without increasing the likelihood of leakage between these regions. The width 240 of the isolation region 202 can be reduced to about 400 nanometers, for example, whereas it was conventionally maintained at around 600 nanometer to mitigate leakage between nwell regions, among other things.

It will be appreciated that the nwell regions 230 serve as active regions where one or more semiconductor devices, such as transistors, for example, can be formed. Accordingly, after the substrate is prepared as described above, device fabrication proceeds at 110 and the instant methodology ends thereafter. It will be appreciated that different transistors can be formed by slightly varying certain fabrication processes and/or selectively exposing different parts of the nwell regions 230 to different processes.

Generally speaking, to establish any transistors, a gate structure and source and drain regions are formed after which silicide, metallization, and/or other back-end processing can be performed. To form the gate structure, a thin gate oxide is formed over the upper surface of the substrate 200 or over one or more nwell regions 230. The gate oxide can be formed by any suitable material formation process, such as thermal oxidation processing, for example. By way of example, the oxide layer can, for example, be formed to a thickness of between about 10 Angstroms and about 500 Angstroms at a temperature of between about 800 degrees Celsius and about 1000 degrees Celsius in the presence of $O_2$. This layer of oxide material can serve as a gate oxide in a high voltage CMOS transistor device, for example. Alternatively, a layer of oxide material having a thickness of about 70 Angstroms or less can be formed to serve as a gate oxide in a low voltage CMOS transistor device, for example.

A gate layer (e.g., of polysilicon or other conductive material) is then deposited over the layer of gate oxide material. The polysilicon layer can, for example, be formed to between about 500 to about 5000 Angstroms, and may include a dopant, such as a p-type dopant (Boron) or n-type dopant (e.g., Phosphorus), depending upon the type(s) of transistors to be formed. The dopant can be in the polysilicon as originally applied, or may be subsequently added thereto (e.g., via a doping process). The gate oxide and gate polysilicon layers are then patterned to form the gate structure, which comprises a gate dielectric and a gate electrode, and which is situated over a channel region in the silicon regions.

With the patterned gate structure formed, LDD, MDD, or other extension implants can be performed, for example, depending upon the type(s) of transistors to be formed, and left and right sidewall spacers can be formed along left and right lateral sidewalls of the patterned gate structure. Implants to form the source (S) region and the drain (D) region are then performed, wherein any suitable masks and implantation processes may be used in forming the source and drain regions to achieve desired transistor types. For example, a PMOS source/drain mask may be utilized to define one or more openings through which a p-type source/drain implant (e.g., Boron (B and/or $BF_2$)) is performed to form p-type source and drain regions for PMOS transistor devices. Similarly, an NMOS source/drain mask may be employed to define one or more openings through which an n-type source/drain implant (e.g., Phosphorous (P) and/or Arsenic (As)) is performed to form n-type source and drain regions for NMOS transistor devices. Depending upon the types of masking techniques employed, such implants may also selectively dope the polysilicon of the gate structure of certain transistors, as desired. It will be appreciated that the channel region is thus defined between the source and drain regions in the different transistors. It will also be appreciated that the channel region can be doped prior to forming the gate oxide to adjust Vt's if desired.

It will be appreciated that while other substrates exist that have a higher initial p type dopant profile, and would thus be more prone to mitigate leakage between adjacent nwell regions, that utilizing such substrates would not be practical since those substrates would have a lower relative resistivity and would thus not be effective for CMOS system on chip RF integration applications because they would not suppress noise while also providing a high quality factor for passive components. For example, a substrate having a p type dopant profile of about $1e^{15}/cm^3$ would only have a relative resistivity of about 10 ohms. Similarly, a substrate having a p type dopant profile of about $1e^{16}/cm^3$ would have a relative resistivity of merely about 1 ohm. While these dopant concentrations would be prone to mitigate leakage between adjacent nwell regions, these relative resistivities would not be sufficient to integrate RF functions on a CMOS chip for system of chip applications. Accordingly, the dual blanket implantation process described herein is desirable since it mitigates leakage between adjacent nwell regions while also allowing substrates to be utilized that have relative resistivities that are sufficient to allow RF functions to be integrated on a CMOS chip for system of chip applications.

It will also be appreciated that engineering a dual blanket implant as described herein is desirable over a single blanket implant because a single blanket implant would have to comprise a small dose so that other device components (e.g., transistors) are not affected by the implant. However, a small dose may not penetrate deeply enough into the substrate to isolate the entirety of adjacent nwell regions from one another. In this manner, nwell islands may develop under the p type doped region, and such nwell islands can present a secondary leakage path that can lead to problems, such as reliability, for example. Additionally, performing a dual blanket implantation as described herein may actually require less total p type dopant (e.g., boron) than would a single blanket implant.

It will be appreciated that while reference is made throughout this document to exemplary structures in discussing aspects of methodologies described herein (e.g., those structures presented in FIGS. 2-6 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs. It will also be appreciated that while one isolation region is illustrated herein, that any suitable number of isolation regions (having any suitable dimensions) can be formed in a semiconductor substrate and dual blanket p type dopant implantations can be performed therethrough, where the implantations may comprise one or more p type dopants. Similarly, multiple nwell regions can be formed, where leakage between the nwell regions is mitigated by blanket implantations of one or more p type dopants according to one or more aspects or embodiments of the present invention, and where one or more n type dopants can be implanted to form the nwells.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A method of preparing a semiconductor substrate utilized to produce a CMOS chip whereon RF functions are integrated for system on chip applications, comprising:
providing a semiconductor substrate having a resistivity of between about 20 ohm-cm and about 60 ohm-cm;
forming an isolation region within the semiconductor substrate;
performing a first blanket implant of p type dopant atoms into the isolation region and into first and second regions of the substrate on opposing sides of the isolation region without a mask covering the isolation region or the first and second regions of the substrate such that the p type dopant atoms are implanted under the isolation region to have a peak of a first depth that is less than a depth of the junction of subsequently formed nwell regions to mitigate leakage between at least some of the subsequently formed nwell regions;

performing a second blanket implant of p type dopant atoms into the isolation region and into the first and second regions of the substrate without a mask covering the isolation region or the first and second regions of the substrate such that the p type dopant atoms are implanted under the isolation region to have a peak of a second depth that is greater than the depth of the junction of the subsequently formed nwell regions to mitigate leakage between at least some of the subsequently formed nwell regions; and performing a third implant of n type dopant atoms into the isolation region and into the first and second regions of the substrate without a mask covering the isolation region or the first and second regions of the substrate to form first and second nwell regions within the first and second regions of the substrate on opposing sides of the isolation region.

2. The method of claim 1, wherein the substrate has a concentration of p type dopant atoms of around $2e^{14}/cm^3$.

3. The method of claim 1, wherein the second implant is performed at an energy of between about 450 keV and about 900 keV and at a dose of about $1e^{12}/cm^2$.

4. The method of claim 1, wherein the isolation region has a width of about 400 nanometers.

5. The method of claim 1, wherein the first depth is between about 1.2 micrometers and about 2.5 micrometers.

6. The method of claim 1, wherein the second depth is between about 2 micrometers and about 3.2 micrometers.

7. The method of claim 1, wherein the third implant is performed at an energy of between about 250 keV and about 500 keV and a dose of between about $3\ e^{13}/cm^2$ and about $8e^{13}/cm^2$ so that the nwell regions are implanted to have a junction depth of between about 1.4 micrometers and about 2.8 micrometers.

8. The method of claim 1, wherein the first implant is performed at an energy of between about 300 keV and about 650 keV and at a dose of between about $0.5e^{12}/cm^2$ and about $5\ e^{12}/cm^2$.

9. The method of claim 8, wherein the second implant is performed at an energy of between about 450 keV and about 900 keV and at a dose of about $1e^{12}/cm^2$.

10. The method of claim 9, wherein the first depth is between about 1.2 micrometers and about 2.5 micrometers and the second depth is between about 2 micrometers and about 3.2 micrometers.

11. The method of claim 10, wherein the third implant is performed at an energy of between about 250 keV and about 500 keV and a dose of between about $3\ e^{13}/cm^2$ and about $8e^{13}/cm^2$ so that the nwell regions are implanted to a depth of between about 1.4 micrometers and about 2.8 micrometers.

12. The method of claim 11, wherein the isolation region has a width of about 400 nanometers.

* * * * *

UNITED STATES PATENT AND TRADEMARK OFFICE
CERTIFICATE OF CORRECTION

PATENT NO.        : 7,662,690 B2                           Page 1 of 1
APPLICATION NO. : 11/343695
DATED             : February 16, 2010
INVENTOR(S)       : Tang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 391 days.

Signed and Sealed this

Twenty-eighth Day of December, 2010

David J. Kappos
*Director of the United States Patent and Trademark Office*